US012804816B2

(12) United States Patent
Xu et al.

(10) Patent No.: US 12,804,816 B2
(45) Date of Patent: Nov. 17, 2026

(54) CIRCUIT BOARD AND MANUFACTURING METHOD THEREOF

(71) Applicants: Avary Holding (Shenzhen) Co., Ltd., Shenzhen (CN); QingDing Precision Electronics (Huai'an) Co., Ltd., Jiangsu Province (CN); Garuda Technology Co., Ltd., New Taipei City (TW)

(72) Inventors: Wan-Ling Xu, Shenzhen (CN); Rui-Wu Liu, Shenzhen (CN); Qiong Zhou, Shenzhen (CN)

(73) Assignees: Avary Holding (Shenzhen) Co., Ltd., Shenzhen (CN); QingDing Precision Electronics (Huai'an) Co., Ltd., Huai'an (CN); Garuda Technology Co., Ltd., New Taipei City (TW)

( * ) Notice: Subject to any disclaimer, the term of this patent is extended or adjusted under 35 U.S.C. 154(b) by 224 days.

(21) Appl. No.: 18/787,519

(22) Filed: Jul. 29, 2024

(65) Prior Publication Data

US 2026/0032819 A1 Jan. 29, 2026

(51) Int. Cl.
*H05K 1/14* (2006.01)
*H05K 1/185* (2026.01)
(Continued)

(52) U.S. Cl.
CPC ............ *H05K 1/144* (2013.01); *H05K 1/185* (2013.01); *H05K 3/28* (2013.01); *H05K 3/30* (2013.01);
(Continued)

(58) Field of Classification Search
CPC .. H05K 3/4697; H05K 3/4652; H05K 3/3431; H05K 3/4644; H05K 3/30;
(Continued)

(56) References Cited

U.S. PATENT DOCUMENTS

2008/0296056 A1* 12/2008 Kinoshita ............. H05K 1/183 29/846
2015/0334841 A1* 11/2015 Schmid ................. H05K 1/183 361/761
(Continued)

FOREIGN PATENT DOCUMENTS

CN 107958877 B 9/2021
JP 2004304159 A 10/2004
(Continued)

*Primary Examiner* — Timothy J Thompson
*Assistant Examiner* — Amol H Patel
(74) *Attorney, Agent, or Firm* — MUNCY, GEISSLER, OLDS & LOWE, P.C.

(57) ABSTRACT

A circuit board includes a first wiring substrate, a second wiring substrate, a channel, a first electronic component, a second electronic component and a sealing material layer. The first wiring substrate includes a first wiring layer and a second wiring layer. The second wiring substrate is disposed on one side of the first wiring substrate. The channel extends through the first wiring substrate and the second wiring substrate. The first electronic component is disposed in the channel and is electrically connected to the first wiring layer. The second electronic component is disposed in the channel and is electrically connected to one of the first wiring layer and the second wiring layer. The sealing material layer fills the channel and covers the first electronic component and the second electronic component.

14 Claims, 8 Drawing Sheets

(51) Int. Cl.
*H05K 3/28* (2006.01)
*H05K 3/30* (2026.01)
*H05K 3/341* (2026.01)
*H05K 3/46* (2006.01)

(52) U.S. Cl.
CPC . *H05K 3/4644* (2013.01); *H05K 2201/09036* (2013.01)

(58) Field of Classification Search
CPC .......... H05K 3/28; H05K 1/144; H05K 1/185; H05K 2201/09036
See application file for complete search history.

(56) References Cited

U.S. PATENT DOCUMENTS

| | | | | |
|---|---|---|---|---|
| 2015/0382469 | A1 | 12/2015 | Hu et al. | |
| 2016/0037645 | A1* | 2/2016 | Lee | H05K 3/4697 29/846 |
| 2017/0047308 | A1* | 2/2017 | Ho | H10W 70/614 |
| 2020/0258688 | A1 | 8/2020 | Berolini et al. | |
| 2021/0185821 | A1* | 6/2021 | Lee | H05K 1/186 |

FOREIGN PATENT DOCUMENTS

| | | | |
|---|---|---|---|
| JP | 2005039005 | A | 2/2005 |
| TW | 201309128 | A | 2/2013 |
| TW | 202406415 | A | 2/2024 |

* cited by examiner

CIRCUIT BOARD AND MANUFACTURING METHOD THEREOF

BACKGROUND

Field of Invention

The present disclosure relates to a circuit board and a method of manufacturing the same.

Description of Related Art

With the advancement of technology, the market demand for lighter and thinner electronic products is also increasing. Therefore, the selective sealing technology that encapsulates chips on circuit boards through molds can effectively reduce the thickness of the module, which is beneficial to the application of lighter and thinner electronic products.

However, the existing selective sealing technology requires molds to be designed with flow passages between the circuit boards, resulting in low layout utilization, long mold design time and high price. Furthermore, during the selective sealing process, due to the height difference between the wiring and the substrate of the circuit board, the mold is not able to fit the circuit board completely, causing the sealing material to flow out of the mold during the sealing process, resulting in glue overflow. In addition, the sealing material is thermosetting material, and its thermal expansion characteristics tend to cause warpage of the module. If the mold material is applied to large volume or large area sealing, or double-sided or embedded sealing that requires multiple sealing, the severity of warpage may be aggravated, which may lead to a decrease in the yield rate.

SUMMARY

At least one embodiment of the present disclosure provides a circuit board that can reduce the thickness and improve packaging efficiency, and reduce glue overflow and warpage, thereby improving the yield rate.

At least another embodiment of the present disclosure provides a method of manufacturing the abovementioned circuit board to help reduce the thickness and improve packaging efficiency, and reduce glue overflow and warpage, thereby improving the yield rate of the above-mentioned circuit board.

The circuit board according to at least one embodiment of the present disclosure includes a first wiring substrate, a second wiring substrate, a channel, a first electronic component, a second electronic component and a sealing material layer. The first wiring substrate has a first side and a second side opposite to the first side, and includes a first wiring layer, a second wiring layer and a first insulating layer located between the first wiring layer and the second wiring layer. The second wiring substrate is disposed on one of the first side and the second side, and includes a second insulating layer and a third wiring layer, where the third wiring layer is located on a first surface of the second insulating layer facing away from the first wiring substrate. The channel extends through the first wiring substrate and the second wiring substrate. The first electronic component is disposed in the channel and is electrically connected to the first wiring layer. The second electronic component is disposed in the channel and is electrically connected to one of the first wiring layer and the second wiring layer. The sealing material layer fills the channel and covers the first electronic component and the second electronic component.

The method of manufacturing the circuit board according to at least another embodiment of the present disclosure includes the following steps. A first initial wiring substrate is provided, where the first initial wiring substrate includes a first initial wiring layer, a second initial wiring layer and a first initial insulating layer located between the first initial wiring layer and the second initial wiring layer. The first initial wiring layer and the second initial wiring layer are patterned to form a first wiring layer and a flow passage. After the first wiring layer and the flow passage are formed, a second initial wiring substrate and a first initial insulating connection layer are provided, the first initial insulating connection layer is disposed between the first initial wiring substrate and the second initial wiring substrate, and the first initial wiring substrate, the first initial insulating connection layer and the second initial wiring substrate are laminated. After the first initial wiring substrate, the first initial insulating connection layer and the second initial wiring substrate are laminated, the second initial wiring layer and the first initial insulating layer are patterned to form a first wiring substrate and a first groove, where the first wiring substrate includes the first wiring layer, a second wiring layer and a first insulating layer. A first electronic component is mounted in the first groove to electrically connect to the first wiring layer. After the first electronic component is mounted in the first groove, a third initial wiring substrate and a second initial insulating connection layer are provided, the second initial insulating connection layer is disposed between the first wiring substrate and the third initial wiring substrate, and the first wiring substrate, the first initial insulating connection layer, the second initial wiring substrate, the second initial insulating connection layer and the third initial wiring substrate are laminated. After the first wiring substrate, the first initial insulating connection layer, the second initial wiring substrate, the second initial insulating connection layer and the third initial wiring substrate are laminated, the second initial wiring substrate, the third initial wiring substrate, the first initial insulating connection layer and the second initial insulating connection layer are patterned to form a second wiring substrate, a third wiring substrate, a first insulating connection layer, a second insulating connection layer, a second groove and a third groove. A second electronic component is mounted in the second groove to electrically connect to the first wiring layer. A third electronic component is mounted in the third groove to electrically connect to the second wiring layer. After the second electronic component is mounted in the second groove, a first holding plate is attached to the second wiring substrate. After the third electronic component is mounted in the third groove, a second holding plate is attached to the third wiring substrate, where the second holding plate has an opening, and the opening, the flow passage, the first groove, the second groove and the third groove are interconnected. A sealing material is injected into the opening. After the sealing material is injected into the opening, the first holding plate and the second holding plate are removed.

It is to be understood that both the foregoing general description and the following detailed description are by examples, and are intended to provide further explanation of the present disclosure as claimed.

BRIEF DESCRIPTION OF THE DRAWINGS

The present disclosure can be more fully understood by reading the following detailed description of the embodiment, with reference made to the accompanying drawings as follows.

DETAILED DESCRIPTION

Figure 1:
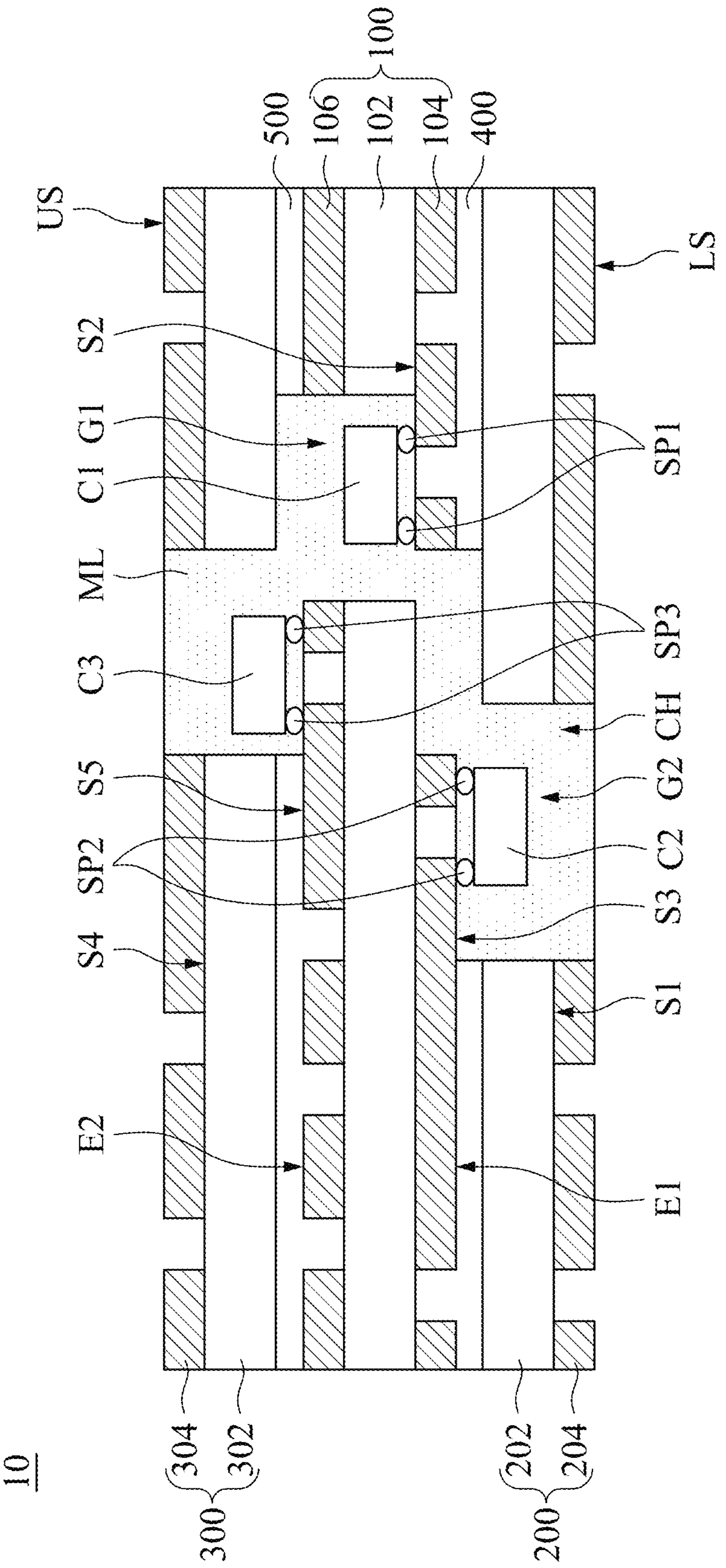
FIG. 1 is a partial schematic cross-sectional view of a circuit board according to at least one embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

In the following description, in order to clearly present the technical features of the present disclosure, the dimensions (such as length, width, thickness, and depth) of elements (such as layers, films, substrates, and areas) in the drawings will be enlarged in unequal proportions. Therefore, the description and explanation of the following embodiments are not limited to the sizes and shapes presented by the elements in the drawings, but should cover the sizes, shapes, and deviations of the two due to actual manufacturing processes and/or tolerances. For example, the flat surface shown in the drawings may have rough and/or non-linear characteristics, and the acute angle shown in the drawings may be round. Therefore, the elements presented in the drawings in this case are mainly for illustration, and are not intended to accurately depict the actual shape of the elements, nor are they intended to limit the scope of patent applications in this case.

Furthermore, the words "about", "approximately" or "substantially" used in the present disclosure not only cover the clearly stated numerical values and numerical ranges, but also cover those that can be understood by a person with ordinary knowledge in the technical field to which the present disclosure belongs. The permissible deviation range can be determined by the error generated during measurement, and the error is caused, for example, by limitations of the measurement system or process conditions. For example, two objects (such as the plane or traces of a substrate) are "substantially parallel" or "substantially perpendicular," where "substantially parallel" and "substantially perpendicular," respectively, mean that parallelism and perpendicularity between the two objects can include non-parallelism and non-perpendicularity caused by permissible deviation ranges.

The spatial relative terms used in the present disclosure, such as "below," "under," "above," "on," and the like, are intended to facilitate the recitation of a relative relationship between one element or feature and another as depicted in the figures. The true meaning of these spatial relative terms includes other orientations. For example, the relationship between one element and another may change from "below" and "under" to "above" and "on" when the figure is turned 180 degrees up or down. In addition, spatially relative descriptions used in the present disclosure should be interpreted in the same manner.

It should be understood that while the present disclosure may use terms such as "first", "second", "third", etc. to describe various elements or features, these elements or features should not be limited by these terms. These terms are primarily used to distinguish one element from another, or one feature from another. In addition, the term "or" as used in the present disclosure may include, as appropriate, any one or a combination of the listed items in association.

Although a series of operations or steps are used to illustrate the manufacturing method in the present disclosure, the order shown in these operations or steps should not be construed as a limitation of the present disclosure. For example, some operations or steps may be performed in a different order and/or concurrently with other steps. In addition, each operation or step described herein may include several sub-steps or actions.

Moreover, the present disclosure may be implemented or applied in various other specific embodiments, and the details of the present disclosure may be combined, modified, and altered in various embodiments based on different viewpoints and applications, without departing from the idea of the present disclosure.

FIG. 1 is a partial schematic cross-sectional view of a circuit board 10 according to at least one embodiment of the present disclosure. Referring to FIG. 1, the circuit board 10 includes a first wiring substrate 100, a second wiring substrate 200, a channel CH, a first electronic component C1, a second electronic component C2 and a sealing material layer ML.

The first wiring substrate 100 has a first side E1 and a second side E2 opposite to the first side E1, and includes a first wiring layer 104, a second wiring layer 106, and a first insulating layer 102 located between the first wiring layer 104 and the second wiring layer 106. The second wiring substrate 200 is disposed on the first side E1, and includes a second insulating layer 202 and a third wiring layer 204 located on a first surface S1 of the second insulating layer 202 facing away from the first wiring substrate 100, but is not limited thereto. In other embodiments, the second wiring substrate 200 may be disposed on the second side E2, that is, the second wiring substrate 200 may be disposed on one of the first side E1 and the second side E2.

The channel CH extends through the first wiring substrate 100 and the second wiring substrate 200. The first electronic component C1 is disposed in the channel CH and is electrically connected to the first wiring layer 104. The second electronic component C2 is disposed in the channel CH and is electrically connected to the first wiring layer 104, and the sealing material layer ML fills the channel CH and covers the first electronic component C1 and the second electronic component C2, but is not limited thereto. In other embodiments, the second electronic component C2 may be electrically connected to the second wiring layer 106, that is, the second electronic component C2 may be electrically connected to one of the first wiring layer 104 and the second wiring layer 106.

By arranging the channel CH in the circuit board 10 and having the sealing material layer ML fill the channel CH and cover the first electronic component C1 and the second electronic component C2, multiple electronic components can be embedded and packaged at one time, which can reduce the thickness, improve packaging efficiency, and reduce glue overflow and warpage, thereby improving the yield rate.

Referring to FIG. 1, the first electronic component C1 is located on a second surface S2 of the first wiring layer 104 facing the first insulating layer 102. The second electronic component C2 is located on a third surface S3 of the first wiring layer 104 facing away from the first insulating layer 102. That is, the first electronic component C1 and the second electronic component C2 are respectively located on two opposite surfaces of the first wiring layer 104. For example, soldering parts SP1 and SP2 are respectively disposed between the first electronic component C1 and the second surface S2 and between the second electronic component C2 and the third surface S3. The soldering part SP1 located between the first electronic component C1 and the second surface S2 is in contact with the first electronic component C1 and the second surface S2 to electrically connect to the first electronic component C1 and the first wiring layer 104. The soldering part SP2 located between the second electronic component C2 and the third surface S3 is in contact with the second electronic component C2 and the third surface S3 to electrically connect to the second electronic component C2 and the first wiring layer 104.

The circuit board 10 further includes a third wiring substrate 300 disposed on the second side E2 and including a third insulating layer 302 and a fourth wiring layer 304, where the fourth wiring layer 304 is located on a fourth surface S4 of the third insulating layer 302 facing away from the first wiring substrate 100, that is, the first wiring substrate 100 is located between the second wiring substrate 200 and the third wiring substrate 300, and the channel CH further extends through the third wiring substrate 300, but is not limited thereto. In other embodiments, the third wiring substrate 300 may be disposed on the first side E1, that is, the second wiring substrate 200 may be disposed on one of the first side E1 and the second side E2, and the third wiring substrate 300 may be disposed on the other one of the first side E1 and the second side E2.

As shown in FIG. 1, the circuit board 10 further includes a third electronic component C3, which is disposed in the channel CH and is electrically connected to the second wiring layer 106. The sealing material layer ML further covers the third electronic component C3, and the third electronic component C3 is located on a fifth surface S5 of the second wiring layer 106 facing away from the first insulating layer 102, that is, the first insulating layer 102 is located between the second electronic component C2 and the third electronic component C3. For example, a soldering part SP3 is disposed between the third electronic component C3 and the fifth surface S5 and is in contact with the third electronic component C3 and the fifth surface S5 to electrically connect to the third electronic component C3 and the second wiring layer 106.

In other embodiments, the third electronic component C3 may be electrically connected to the first wiring layer 104, that is, the second electronic component C2 may be electrically connected to one of the first wiring layer 104 and the second wiring layer 106, and the third electronic component C3 may be electrically connected to the other one of the first wiring layer 104 and the second wiring layer 106. In addition, the second electronic component C2 may be located on the fifth surface S5 of the second wiring layer 106 facing away from the first insulating layer 102, and the third electronic component C3 may be located on the third surface S3 of the first wiring layer 104 facing away from the first insulating layer 102. That is, the second electronic component C2 may be located on the surface of one of the first wiring layer 104 and the second wiring layer 106 facing away from the first insulating layer 102, and the third electronic component C3 may be located on the surface of the other one of the first wiring layer 104 and the second wiring layer 106 facing away from the first insulating layer 102. Furthermore, in some embodiments, on the normal line of the first wiring substrate 100, the first electronic component C1, the second electronic component C2 and the third electronic component C3 do not overlap each other.

By arranging the channel CH in the circuit board 10 and having the sealing material layer ML fill the channel CH and cover the first electronic component C1, the second electronic component C2 and the third electronic component C3, multiple electronic components can be embedded and double-sided packaged at one time, which can reduce the thickness, improve packaging efficiency, and reduce glue overflow and warpage, thereby improving the yield rate.

Referring to FIG. 1, the circuit board 10 further includes a first insulating connection layer 400 and a second insulating connection layer 500. The first insulating connection layer 400 is disposed between the first wiring substrate 100 and the second wiring substrate 200, and connects to the first wiring substrate 100 and the second wiring substrate 200. The second insulating connection layer 500 is disposed between the first wiring substrate 100 and the third wiring substrate 300, and connects the first wiring substrate 100 and the third wiring substrate 300.

The circuit board 10 has an upper surface US and a lower surface LS opposite to the upper surface US. The fourth wiring layer 304 has the upper surface US and the third wiring layer 204 has the lower surface LS. The channel CH extends from the upper surface US to the lower surface LS, and continuously extends through the fourth wiring layer 304, the third insulating layer 302, the second insulating connection layer 500, the second wiring layer 106, the first insulating layer 102, the first wiring layer 104, the first insulating connection layer 400, the second insulating layer 202 and the third wiring layer 204.

In addition, as shown in FIG. 1, the channel CH includes a first groove G1 and a second groove G2. The first groove G1 extends through the second wiring layer 106 and the first insulating layer 102, and exposes the first wiring layer 104. The second groove G2 extends through the third wiring layer 204, the second insulating layer 202 and the first insulating connection layer 400, and exposes the first wiring layer 104. In detail, the first groove G1 exposes the second surface S2 of the first wiring layer 104 facing the first insulating layer 102, and the second groove G2 exposes the third surface S3 of the first wiring layer 104 facing away from the first insulating layer 102. Therefore, the first electronic component C1 and the second electronic component C2 can be respectively disposed on two opposite surfaces of the first wiring layer 104, thereby saving the embedded space of the circuit board.

In some embodiments, the material of the sealing material layer ML may include epoxy resin and silicon dioxide, such as epoxy molding compound (EMC). The material of the sealing material layer ML has a particle diameter, and the minimum width of channel CH is greater than twice the particle diameter.

In some embodiments, the materials of the first insulating layer 102, the second insulating layer 202, the third insulating layer 302, the first insulating connecting layer 400 and the second insulating connecting layer 500 may include resin, such as low flow prepreg or no flow prepreg. The materials of the first wiring layer 104, the second wiring layer 106, the third wiring layer 204 and the fourth wiring layer 304 may include metal, such as copper. The first electronic component C1, the second electronic component C2 and the third electronic component C3 may be chips.

Figure 2A:
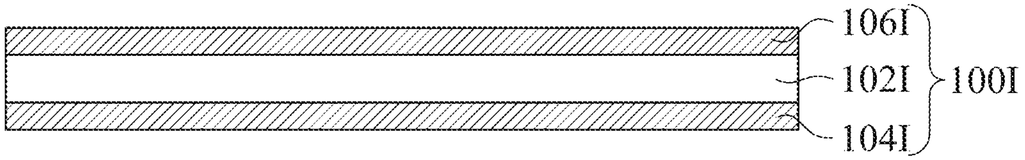
FIGS. 2A to 2M are partial schematic cross-sectional views of a method of manufacturing the circuit board in FIG. 1.

FIGS. 2A to 2M are partial schematic cross-sectional views of a method of manufacturing the circuit board 10 in FIG. 1. First, referring to FIG. 2A, a first initial wiring substrate 100I is provided, which includes a first initial wiring layer 104I, a second initial wiring layer 106I, and a first initial insulating layer 102I located between the first initial wiring layer 104I and the second initial wiring layer 106I.

Figure 2B:
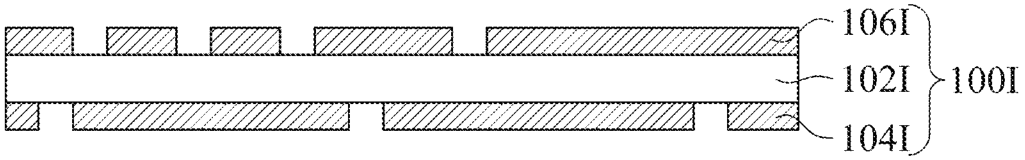
Figure 2C:
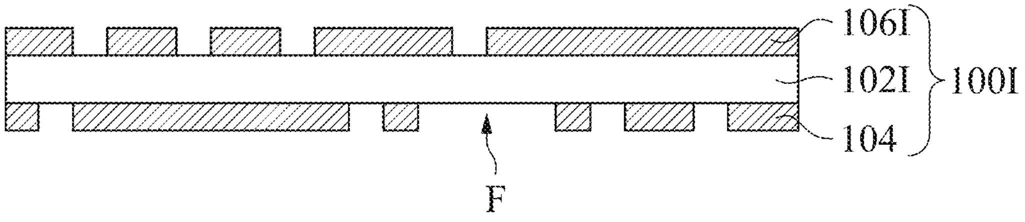

Referring to FIG. 2B and FIG. 20, the first initial wiring layer 104I and the second initial wiring layer 106I are patterned to form a first wiring layer 104 and a flow passage F. In detail, as shown in FIG. 2B, the first initial wiring layer 104I and the second initial wiring layer 106I may be patterned to remove portions of the first initial wiring layer 104I and the second initial wiring layer 106I, Then, as shown in FIG. 20, the remaining portion of the first initial wiring layer 104I is patterned to form the first wiring layer 104 and the flow passage F. In some embodiments, patterning the first initial wiring layer 104I and the second initial wiring layer 106I as shown in FIG. 2B can be implemented by an etching process. Patterning the remaining portion of the first initial wiring layer 104I to form the first wiring layer 104 and the flow passage F as shown in FIG. 2C can be implemented by a laser process, a machining process, an etching process, or a combination of the foregoing processes.

Figure 2D:
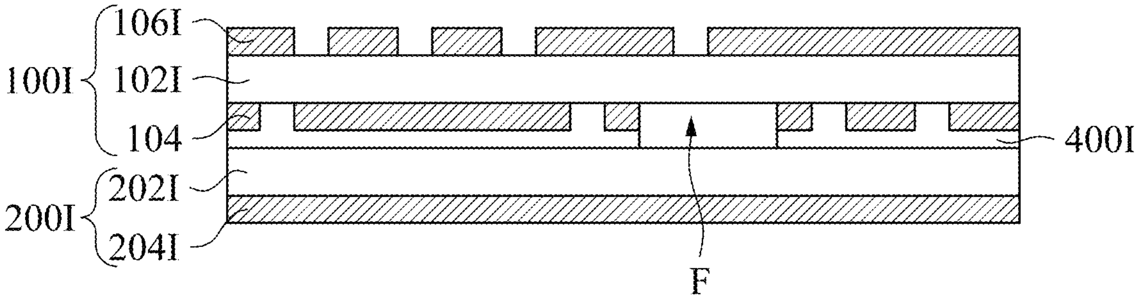

Referring to FIG. 2D, after the first wiring layer 104 and the flow passage F are formed, a second initial wiring substrate 200I and a first initial insulating connection layer 400I are provided, the first initial insulating connection layer 400I is disposed between the first initial wiring substrate 100I and the second initial wiring substrate 200I, and the first initial wiring substrate 100I, the first initial insulating connection layer 400I and the second initial wiring substrate 200I are laminated, where the second initial wiring substrate 200I includes a second initial insulating layer 202I and a third initial wiring layer 204I.

Figure 2E:
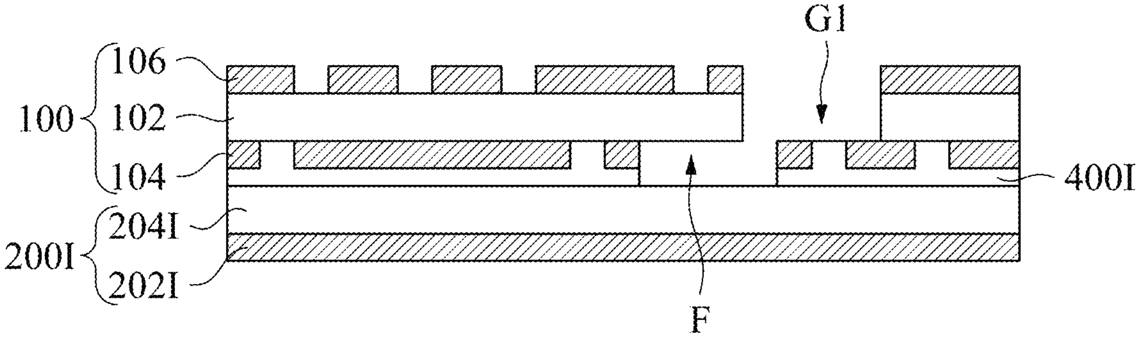

Referring to FIG. 2E, after the first initial wiring substrate 100I, the first initial insulating connection layer 400I and the second initial wiring substrate 200I are laminated, the second initial wiring layer 106I and the first initial insulating layer 102I are patterned to form a first wiring substrate 100 and a first groove G1. The first wiring substrate 100 includes a first wiring layer 104, a second wiring layer 106 and a first insulating layer 102 located between the first wiring layer 104 and the second wiring layer 106. In some embodiments, patterning the second initial wiring layer 106I and the first initial insulating layer 102I to form the first wiring substrate 100 and the first groove G1 can be implemented by a laser process, a machining process, an etching process, or a combination of the foregoing processes.

Figure 2F:
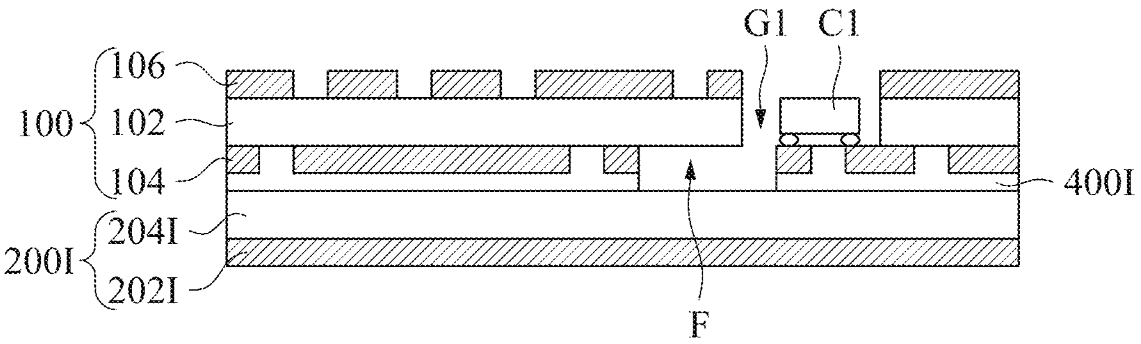
Figure 2G:
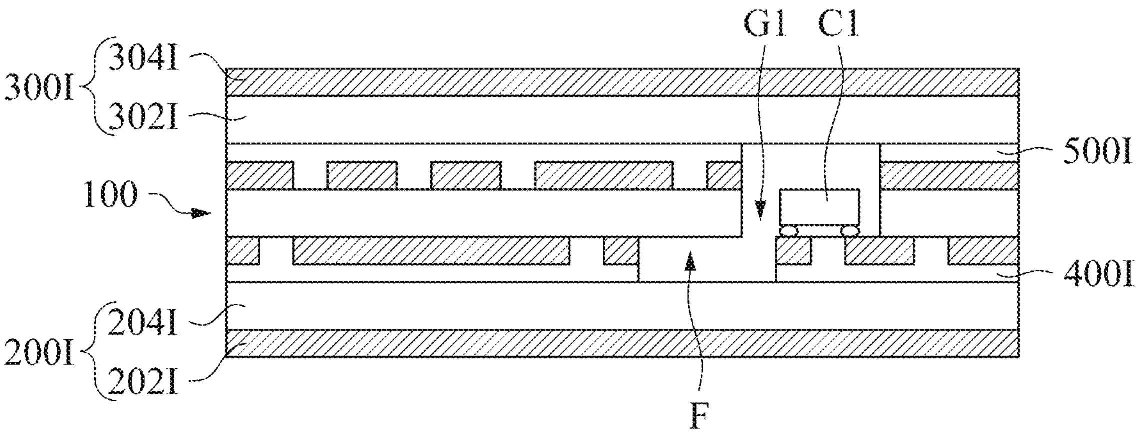

Referring to FIG. 2F, a first electronic component C1 is mounted in the first groove G1 to electrically connected to the first wiring layer 104. Next, referring to FIG. 2G, after the first electronic component C1 is mounted in the first groove G1, a third initial wiring substrate 300I and a second initial insulating connection layer 500I are provided, the second initial insulating connection layer 500I is disposed between the first wiring substrate 100 and the third initial wiring substrates 300I, and the first wiring substrate 100, the first initial insulating connection layer 400I, the second initial wiring substrate 200I, the second initial insulating connection layer 500I and the third initial wiring substrate 300I are laminated, where the third initial wiring substrate 300I includes a third initial insulating layer 302I and a fourth initial wiring layer 304I. In some embodiments, mounting the first electronic component C1 in the first groove G1 to electrically connect to the first wiring layer 104 can be implemented by a soldering process.

Figure 2H:
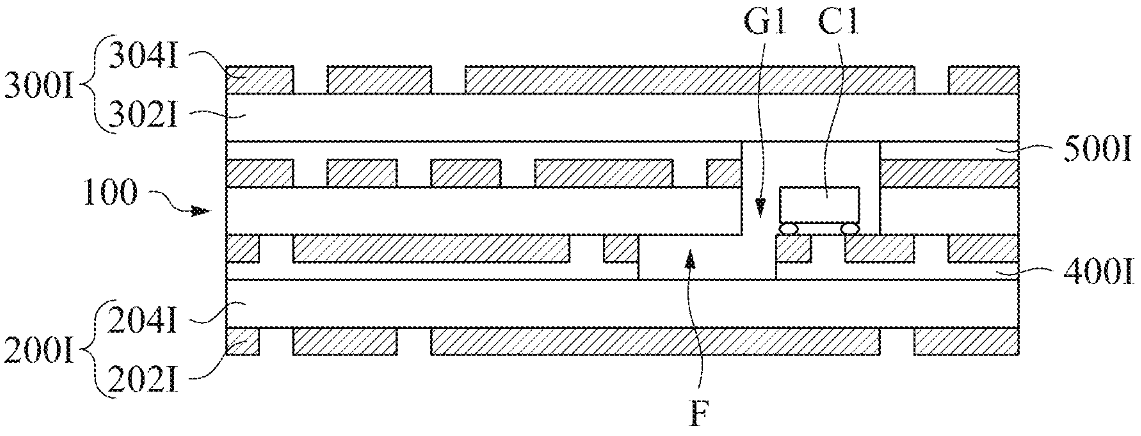
Figure 2I:
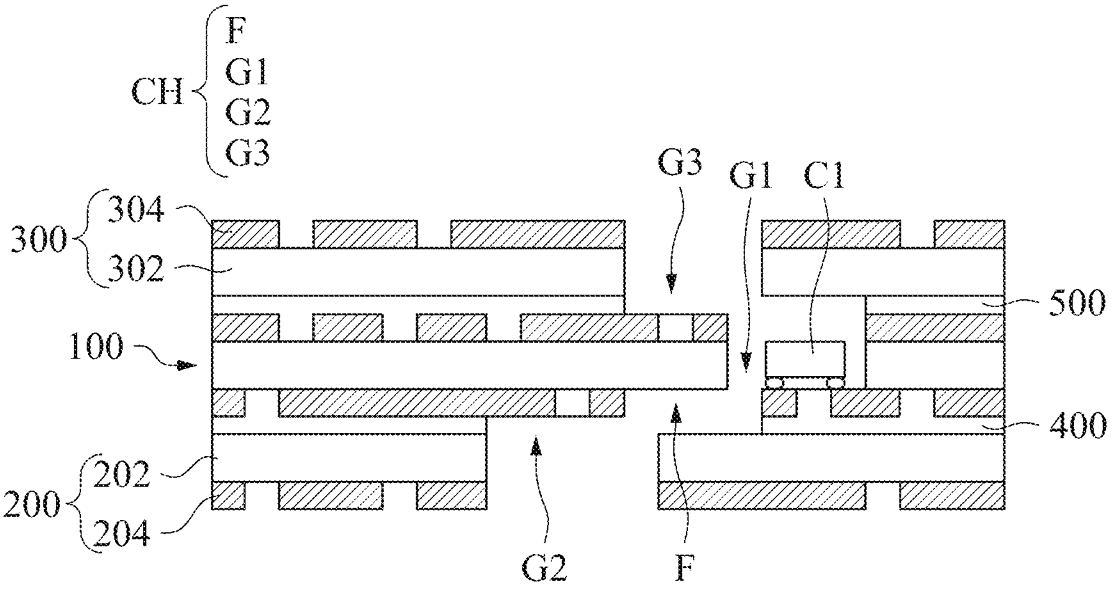

Referring to FIG. 2H and FIG. 2I, after the first wiring substrate 100, the first initial insulating connection layer 400I, the second initial wiring substrate 200I, the second initial insulating connection layer 500I and the third initial wiring substrate 300I are laminated, the second initial wiring substrate 200I, the third initial wiring substrate 300I, the first initial insulating connection layer 400I and the second initial insulating connection layer 500I are patterned to form a second wiring substrate 200, a third wiring substrate 300 and a first insulating connection layer 400, a second insulating connection layer 500, a second groove G2 and a third groove G3.

In detail, as shown in FIG. 2H, the third initial wiring layer 204I and the fourth initial wiring layer 304I can be patterned to remove portions of the third initial wiring layer 204I and the fourth initial wiring layer 304I. Then, as shown in FIG. 2I, the second initial insulating layer 202I, the third initial insulating layer 302I, the first initial insulating connection layer 400I, the second initial insulating connection layer 500I, the remaining portion of the third initial wiring layer 204I and the remaining portion of the fourth initial wiring layer 304I are patterned to form the second wiring substrate 200, the third wiring substrate 300, the first insulating connection layer 400, the second insulating connection layer 500, the second groove G2 and the third groove G3. The second wiring substrate 200 includes a second insulating layer 202 and a third wiring layer 204 located on a surface of the second insulating layer 202 facing away from the first wiring substrate 100. The third wiring substrate 300 includes a third insulating layer 302 and a fourth wiring layer 304 located on a surface of the third insulating layer 302 facing away from the first wiring substrate 100. The flow passage F, the first groove G1, the second groove G2 and the third groove G3 are interconnected to form a channel CH, but is not limited to this. In other embodiments, the channel CH may further include other flow passages and/or grooves.

In some embodiments, patterning the third initial wiring layer 204I and the fourth initial wiring layer 304I as shown in FIG. 2H can be implemented by an etching process. Patterning the second initial insulating layer 202I, the third initial insulating layer 302I, the first initial insulating connection layer 400I, the second initial insulating connection layer 500I, the remaining portion of the third initial wiring layer 204I and the remaining portion of the fourth initial wiring layer 304I to form the second wiring substrate 200, the third wiring substrate 300, the first insulating connection layer 400, the second insulating connection layer 500, the second groove G2 and the third groove G3 as shown in FIG. 2I can be implemented by a laser process, a machining process, an etching process or a combination of the foregoing processes.

Figure 2J:
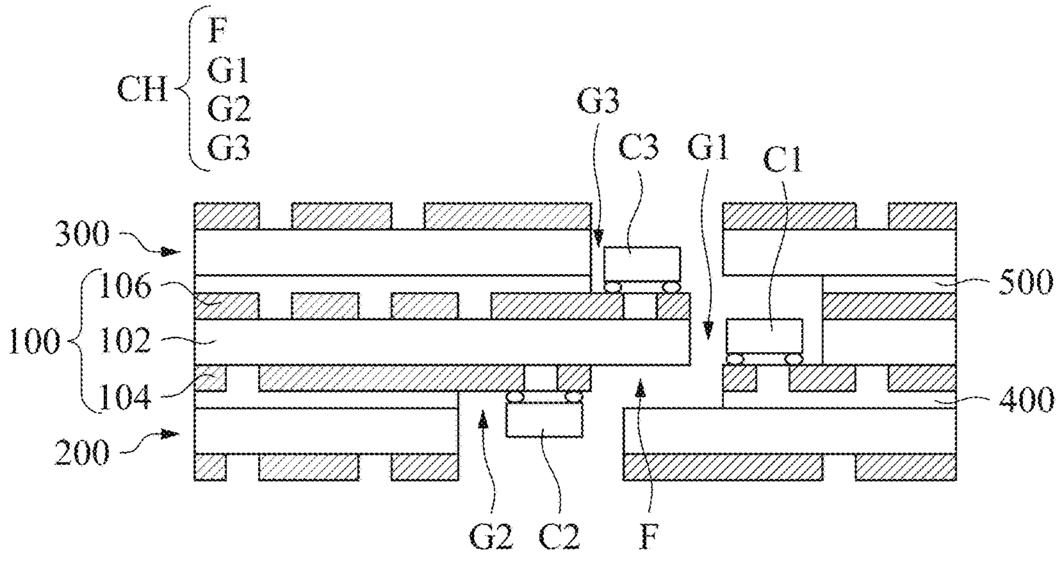

Referring to FIG. 2J, a second electronic component C2 is mounted in the second groove G2 to electrically connect to the first wiring layer 104. A third electronic component C3 is mounted in the third groove G3 to electrically connect to the second wiring layer 106. In some embodiments, mounting the second electronic component C2 and the third electronic component C3 in the second groove G2 and the third groove G3 to electrically connect to the first wiring layer 104 and the second wiring layer 106 respectively can be implemented by a soldering process.

Figure 2K:
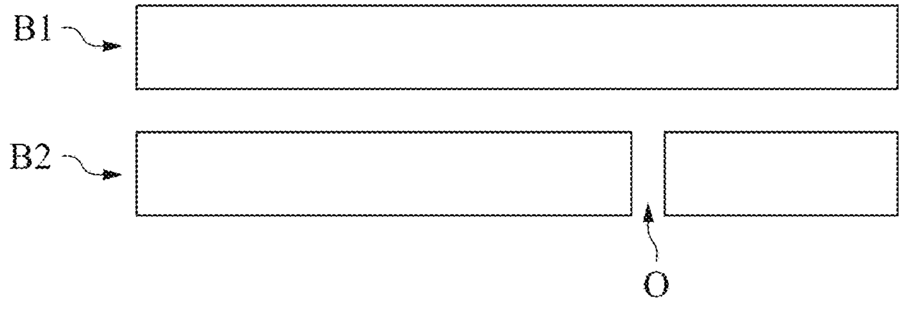
Figure 2L:
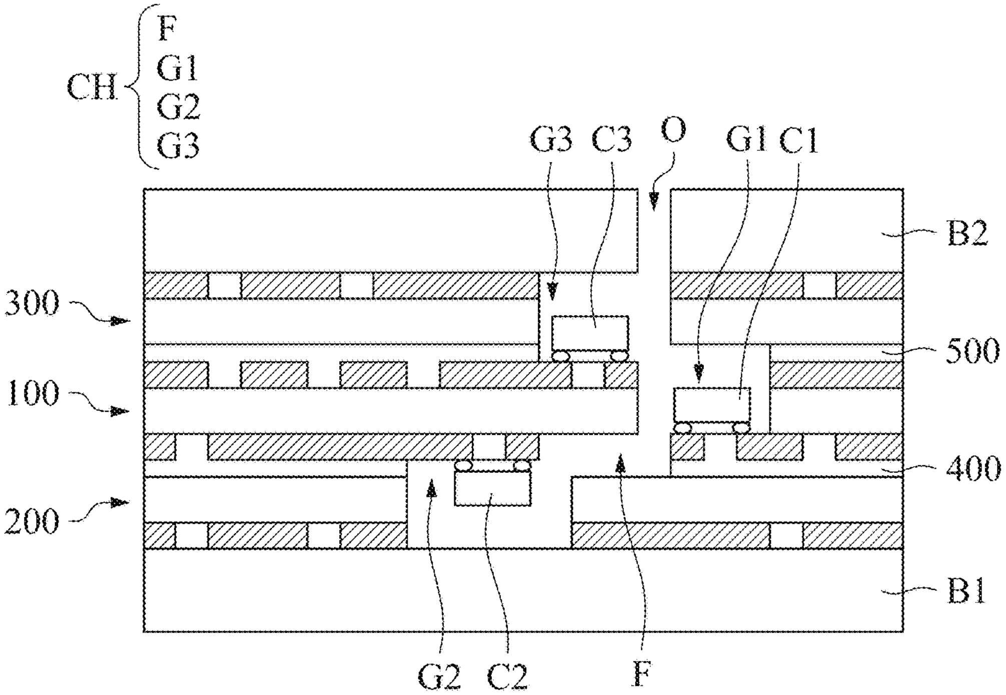

Referring to FIG. 2K and FIG. 2L, after the second electronic component C2 is mounted in the second groove G2, a first holding plate B1 is attached to the second wiring substrate 200. After the third electronic component C3 is mounted in the third groove G3, a second holding plate B2 is attached to the third wiring substrate 300. The second holding plate B2 has an opening O, where the opening O, the flow passage F, the first groove G1, the second groove G2 and the third groove G3 are interconnected. In detail, as shown in FIG. 2K, the first holding plate B1 and the second holding plate B2 with the opening O are provided. Then, as shown in FIG. 2L, the first holding plate B1 and the second holding plate B2 are attached to the second wiring substrate 200 and the third wiring substrate 300 respectively.

Figure 2M:
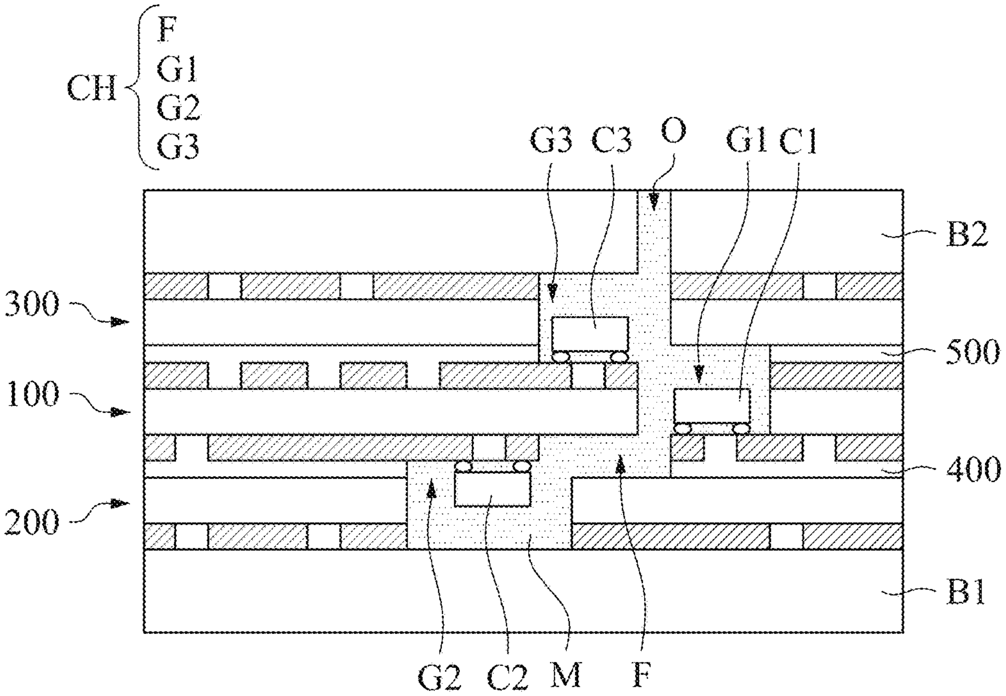

Referring to FIG. 2M, the sealing material M is injected into the opening O. Next, after the sealing material M is injected into the opening O, the first holding plate B1 and the second holding plate B2 are removed to form the circuit board 10 as shown in FIG. 1. In some embodiments, the sealing material M may include epoxy resin and silicon dioxide, such as epoxy molding compound (EMC), the sealing material M has a particle diameter, and the diameter of the opening O is larger than twice the particle diameter. In addition, the sealing material M can be cured through a baking process, and then the first holding plate B1 and the second holding plate B2 can be removed to form the circuit board 10 shown in FIG. 1. The sealing material M protrudes from the second wiring substrate 200 and the third wiring substrate 300 can be removed through a grinding process, a cutting process, or a combination of the foregoing processes to form the sealing material layer ML shown in FIG. 1.

Figure 3:
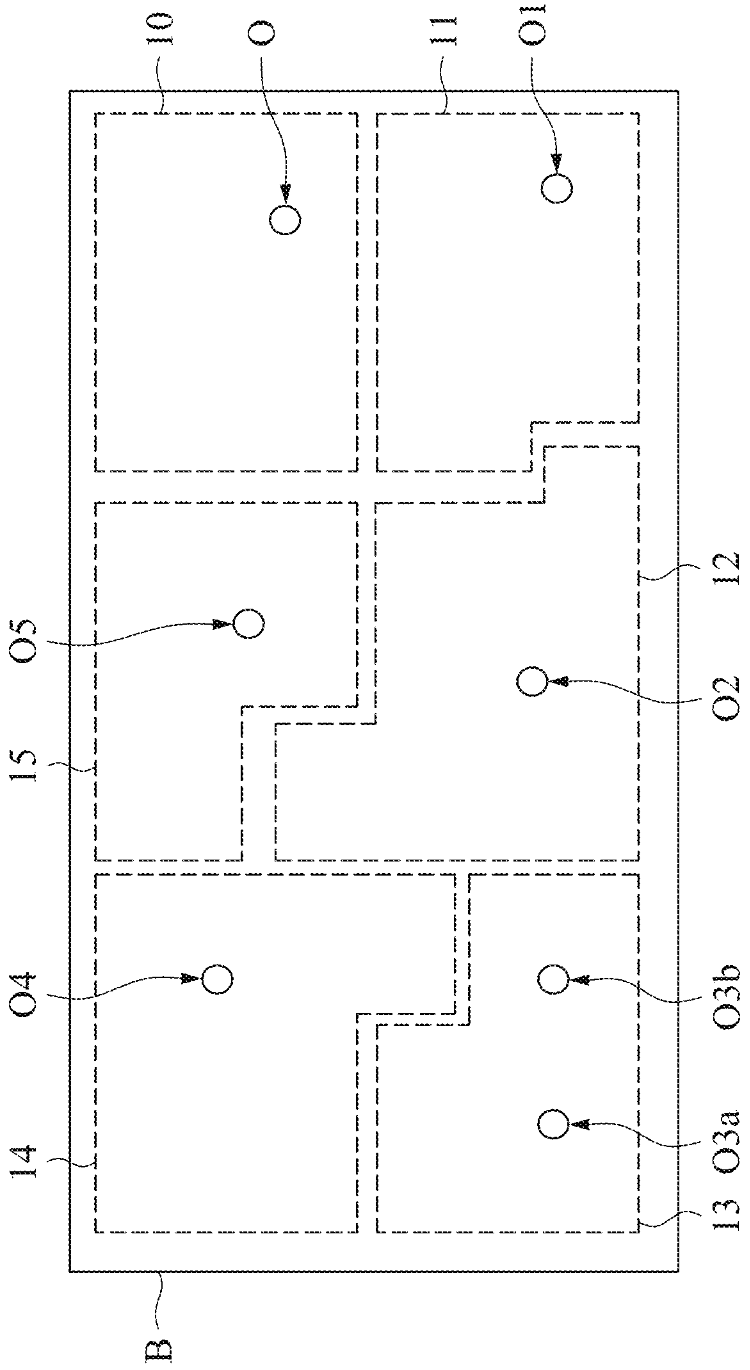
FIG. 3 is a schematic top view of a holding plate and multiple circuit boards according to at least one embodiment of the present disclosure.

FIG. 3 is a schematic top view of a holding plate and multiple circuit boards according to at least one embodiment of the present disclosure. Referring to FIG. 3, multiple circuit boards 10, 11, 12, 13, 14, 15 with different shapes are spliced together, and a holding plate B is disposed outside the circuit boards 10, 11, 12, 13, 14, 15. The holding plate B has multiple openings O, O1, O2, O3*a*, O3*b*, O4, O5 respectively corresponding to the circuit boards 10, 11, 12, 13, 14, 15 for injecting the sealing material. The aforementioned design eliminates the need to design flow passages between circuit boards and customized molds, and can be applied to circuit boards with different shapes, thus increasing the layout utilization, reducing the cost of the molds and the complexity of the process, and at the same time, effectively solving glue overflow and warpage, thus improving the yield rate.

In summary, in the abovementioned circuit board and its manufacturing method in at least one embodiment of the present disclosure, by arranging the channel in the circuit board and having the sealing material layer fill the channel and cover multiple electronic components, multiple electronic components can be embedded and double-sided packaged at one time, which can reduce the thickness, improve packaging efficiency, and reduce glue overflow and warpage, thereby improving the yield rate.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A circuit board, comprising:

a first wiring substrate, having a first side and a second side opposite to the first side, and comprising a first wiring layer, a second wiring layer and a first insulating layer located between the first wiring layer and the second wiring layer;

a second wiring substrate, disposed on one of the first side and the second side, and comprising a second insulating layer and a third wiring layer, wherein the third wiring layer is located on a first surface of the second insulating layer facing away from the first wiring substrate;

a channel, extending through the first wiring substrate and the second wiring substrate;

a first electronic component, disposed in the channel and electrically connected to the first wiring layer;

a second electronic component, disposed in the channel and electrically connected to one of the first wiring layer and the second wiring layer;

a sealing material layer, filling the channel and covering the first electronic component and the second electronic component; and a first insulating connection layer disposed between the first wiring substrate and the second wiring substrate, and connecting to the first wiring substrate and the second wiring substrate, wherein the channel comprises a first groove extending through the second wiring layer and the first insulating layer, and exposing the first wiring layer, wherein the first wiring layer is embedded in the first insulating connection layer.

2. The circuit board of claim 1, wherein the first electronic component is disposed in the first groove and located on a second surface of the first wiring layer facing the first insulating layer.

3. The circuit board of claim 1, wherein the channel comprises a second groove extending through the third wiring layer, the second insulating layer and the first insulating connection layer, and exposing the first wiring layer.

4. The circuit board of claim 3, wherein the second electronic component is disposed in the second groove and located on a third surface of one of the first wiring layer and the second wiring layer facing away from the first insulating layer.

5. The circuit board of claim 1, further comprises a third wiring substrate, wherein the first wiring substrate is located between the second wiring substrate and the third wiring substrate, and the third wiring substrate comprises a third insulating layer and a fourth wiring layer, wherein the fourth wiring layer is located on a fourth surface of the third insulating layer facing away from the first wiring substrate, and the channel further extends through the third wiring substrate.

6. The circuit board of claim 5, further comprises a third electronic component, wherein the second electronic component and the third electronic component are electrically connected to the first wiring layer and the second wiring layer, the sealing material layer further covers the third electronic component, and the first insulating layer is located between the second electronic component and the third electronic component.

7. The circuit board of claim 6, wherein the second electronic component is located on a third surface of the first wiring layer facing away from the first insulating layer, and the third electronic component is located on a fifth surface of the second wiring layer facing away from the first insulating layer.

8. The circuit board of claim 6, wherein the first electronic component, the second electronic component and the third electronic component do not overlap each other on a normal line of the first wiring substrate.

9. The circuit board of claim 5, further comprising a second insulating connection layer disposed between the first wiring substrate and the third wiring substrate, and connecting to the first wiring substrate and the third wiring substrate.

10. The circuit board of claim 5, wherein the circuit board has an upper surface and a lower surface opposite to the upper surface, the fourth wiring layer has the upper surface and the third wiring layer has the lower surface, wherein the channel extends from the upper surface to the lower surface.

11. The circuit board of claim 1, wherein a material of the sealing material layer comprises epoxy resin and silicon dioxide.

12. The circuit board of claim 1, wherein a material of the sealing material layer has a particle diameter, and a minimum width of the channel is greater than twice the particle diameter.

13. A method of manufacturing a circuit board, comprising:

providing a first initial wiring substrate comprising a first initial wiring layer, a second initial wiring layer and a first initial insulating layer located between the first initial wiring layer and the second initial wiring layer;

patterning the first initial wiring layer and the second initial wiring layer to form a first wiring layer and a flow passage;

after the first wiring layer and the flow passage are formed, providing a second initial wiring substrate and a first initial insulating connection layer, disposing the first initial insulating connection layer between the first initial wiring substrate and the second initial wiring substrate, and laminating the first initial wiring substrate, the first initial insulating connection layer and the second initial wiring substrate;

after the first initial wiring substrate, the first initial insulating connection layer and the second initial wiring substrate are laminated, patterning the second initial wiring layer and the first initial insulating layer to form a first wiring substrate and a first groove, wherein the first wiring substrate comprises the first wiring layer, a second wiring layer and a first insulating layer located between the first wiring layer and the second wiring layer;

mounting a first electronic component in the first groove to electrically connect to the first wiring layer;

after the first electronic component is mounted in the first groove, providing a third initial wiring substrate and a second initial insulating connection layer, disposing the second initial insulating connection layer between the first wiring substrate and the third initial wiring substrate, and laminating the first wiring substrate, the first initial insulating connection layer, the second initial wiring substrate, the second initial insulating connection layer and the third initial wiring substrate;

after the first wiring substrate, the first initial insulating connection layer, the second initial wiring substrate, the second initial insulating connection layer and the third initial wiring substrate are laminated, patterning the second initial wiring substrate, the third initial wiring substrate, the first initial insulating connection layer and the second initial insulating connection layer to form a second wiring substrate, a third wiring substrate, a first insulating connection layer, a second insulating connection layer, a second groove and a third groove;

mounting a second electronic component in the second groove to electrically connect to the first wiring layer;

mounting a third electronic component in the third groove to electrically connect to the second wiring layer;

after the second electronic component is mounted in the second groove, attaching a first holding plate to the second wiring substrate;

after the third electronic component is mounted in the third groove, attaching a second holding plate to the third wiring substrate, wherein the second holding plate has an opening, and the opening, the flow passage, the first groove, the second groove and the third groove are interconnected;

injecting a sealing material into the opening; and after the sealing material is injected into the opening, removing the first holding plate and the second holding plate.

14. The method of manufacturing the circuit board of claim 13, wherein the sealing material has a particle diameter, and a diameter of the opening is greater than twice the particle diameter.

* * * * *